(12) United States Patent
Jeon et al.

(10) Patent No.: US 8,890,212 B2
(45) Date of Patent: Nov. 18, 2014

(54) NORMALLY-OFF HIGH ELECTRON MOBILITY TRANSISTOR

(71) Applicant: Samsung Electronics Co., Ltd., Suwon-Si (KR)

(72) Inventors: Woo-chul Jeon, Daegu (KR); Young-hwan Park, Seoul (KR); Jae-joon Oh, Seongnam-si (KR); Kyoung-yeon Kim, Seongnam-si (KR); Joon-yong Kim, Seoul (KR); Ki-yeol Park, Suwon-si (KR); Jai-kwang Shin, Anyang-si (KR); Sun-kyu Hwang, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/874,920

(22) Filed: May 1, 2013

(65) Prior Publication Data
US 2014/0091363 A1     Apr. 3, 2014

(30) Foreign Application Priority Data

Sep. 28, 2012 (KR) ........................ 10-2012-0109267

(51) Int. Cl.
*H01L 29/66* (2006.01)
*H01L 29/15* (2006.01)
(Continued)

(52) U.S. Cl.
CPC ......... *H01L 29/778* (2013.01); *H01L 29/42316* (2013.01); *H01L 29/402* (2013.01); *H01L 29/1066* (2013.01); *H01L 29/7786* (2013.01); *H01L 29/2003* (2013.01)
USPC ............... 257/194; 257/76; 257/94; 257/401; 257/613; 257/615; 438/172; 438/483; 438/167; 438/186; 438/191

(58) Field of Classification Search
CPC ........... H01L 29/2003; H01L 29/7787; H01L 29/66462; H01L 29/7786; H01L 29/41766; H01L 29/778; H01L 29/7783; H01L 29/7781; H01L 21/28587
USPC ..................... 257/194, 76, 94, 401, 613, 615, 257/E29.246, E21.403, E29.253, E21.407, 257/E29.089, E29.121, E29.249, E29.252, 257/E21.085, E21.441, E21.451; 438/172, 438/483, 167, 186, 191
See application file for complete search history.

(56) References Cited

U.S. PATENT DOCUMENTS 6,686,059 B2   2/2004   Shirahata
(Continued)

FOREIGN PATENT DOCUMENTS

JP     4815020 B2    11/2011
(Continued)

*Primary Examiner* — Julio J Maldonado
*Assistant Examiner* — Cory Eskridge
(74) *Attorney, Agent, or Firm* — Harness, Dickey & Pierce, P.L.C.

(57) ABSTRACT

According to example embodiments, a normally-off high electron mobility transistor (HEMT) includes: a channel layer having a first nitride semiconductor, a channel supply layer on the channel layer, a source electrode and a drain electrode at sides of the channel supply layer, a depletion-forming layer on the channel supply layer, a gate insulating layer on the depletion-forming layer, and a gate electrode on the gate insulation layer. The channel supply layer includes a second nitride semiconductor and is configured to induce a two-dimensional electron gas (2DEG) in the channel layer. The depletion-forming layer is configured has at least two thicknesses and is configured to form a depletion region in at least a partial region of the 2DEG. The gate electrode contacts the depletion-forming layer.

18 Claims, 5 Drawing Sheets

(51) Int. Cl.
*H01L 33/00* (2010.01)
*H01L 29/12* (2006.01)
*H01L 29/20* (2006.01)
*H01L 29/778* (2006.01)
*H01L 29/10* (2006.01)
*H01L 29/423* (2006.01)
*H01L 29/40* (2006.01)

(56) References Cited

U.S. PATENT DOCUMENTS

| | | | |
|---|---|---|---|
| 7,038,252 | B2 | 5/2006 | Saito et al. |
| 7,129,127 | B2 | 10/2006 | Chidambaram et al. |
| 7,262,472 | B2 | 8/2007 | Pidin |
| 7,816,707 | B2 | 10/2010 | Hikita et al. |
| 2005/0127446 | A1 | 6/2005 | Nakanishi et al. |
| 2009/0173968 | A1* | 7/2009 | Matsunaga et al. ........... 257/192 |
| 2010/0258848 | A1 | 10/2010 | Lidow et al. |
| 2011/0227093 | A1 | 9/2011 | Hikita et al. |
| 2012/0068227 | A1 | 3/2012 | Hikita et al. |
| 2012/0112202 | A1* | 5/2012 | Hwang et al. ................... 257/76 |

FOREIGN PATENT DOCUMENTS

| | | |
|---|---|---|
| KR | 10-0491058 B1 | 5/2005 |
| KR | 10-0933277 B1 | 12/2009 |
| KR | 20100002195 A | 1/2010 |
| KR | 10-0955249 B1 | 4/2010 |
| KR | 20110041550 A | 4/2011 |
| WO | WO-2010/014128 A2 | 2/2010 |

* cited by examiner

NORMALLY-OFF HIGH ELECTRON MOBILITY TRANSISTOR

CROSS-REFERENCE TO RELATED APPLICATION

This application claims priority under 35 U.S.C. §119 to Korean Patent Application No. 10-2012-0109267, filed on Sep. 28, 2012, in the Korean Intellectual Property Office, the disclosure of which is incorporated herein in its entirety by reference.

BACKGROUND

1. Field

Example embodiments relate to a normally-off high electron mobility transistor (HEMT), and more particularly, to a normally-off HEMT including a depletion-forming layer.

2. Description of the Related Art

Various power conversion systems may include a device for controlling a current flow by ON/OFF switching thereof, e.g., a power device. The efficiency of a power conversion system may depend on the efficiency of a power device in the power conversion system.

Many power devices commercialized at present are silicon (Si)-based power Metal-Oxide-Semiconductor Field-Effect Transistors (MOSFETs) and Insulated Gate Bipolar Transistors (IGBTs). However, increasing the efficiency of a silicon-based power device may be limited by the physical properties of silicon, manufacturing processes, and so forth. To overcome these limitations, research has looked at using a group III-V compound semiconductor in a power device. In association with this, a high electron mobility transistor (HEMT) using a heterojunction structure of a compound semiconductor has attracted attention.

A HEMT may include semiconductor layers having different electrical polarization characteristics. In a HEMT, a semiconductor layer having a relatively high polarization rate may induce a two-dimensional electron gas (2DEG) in another semiconductor layer attached thereto, and the 2DEG may have very high electron mobility.

When a gate voltage of a HEMT is 0 V, power consumption may occur in a normally-on state in which a current flows between drain and source electrodes thereof due to a low resistance therebetween. To change to a normally-off state in which no current flows between the drain and source electrodes, a negative voltage may be applied to a gate electrode of a HEMT.

As another method, a HEMT having a depletion-forming layer to implement a normally-off characteristic by which no current flows between drain and source electrodes of the HEMT when a gate voltage thereof is 0 V has been researched.

SUMMARY

Example embodiments relate to a normally-off high electron mobility transistor (HEMT) using a depletion-forming layer.

Additional aspects will be set forth in part in the description which follows and, in part, will be apparent from the description, or may be learned by practice of example embodiments.

According to example embodiments, a normally-off high electron mobility transistor (HEMT) includes: a channel layer including a first nitride semiconductor; a channel supply layer on the channel layer, the channel supply layer including a second nitride semiconductor, the channel supply layer configured to induce a two-dimensional electron gas (2DEG) in the channel layer; a source electrode and a drain electrode at sides of the channel supply layer; a depletion-forming layer on the channel supply layer, the depletion-forming layer configured to form a depletion region in at least a partial region of the 2DEG, the depletion-forming layer having at least two thicknesses; a gate insulation layer on the depletion-forming layer; and a gate electrode on the gate insulation layer, the gate electrode contacting the depletion-forming layer.

In example embodiments, the depletion-forming layer may include a first part having a first thickness, a second part at a side of the first part, and a third part at a different side of the first part. The second part and the third part may have a second thickness.

In example embodiments, the first thickness may be thicker than the second thickness.

In example embodiments, the first part of the depletion-forming layer may be a strip shape, and the second part and third part may be a strip shape in parallel to the first part.

In example embodiments, the second part and the third part may be spaced apart from the source electrode and the drain electrode, respectively.

In example embodiments, the first part of the depletion-forming layer may be configured to form the depletion region below the first part, and an electron density of the 2DEG below the second part and the third part of the depletion-forming layer may be lower than an electron density of the 2DEG that is not located below the depletion-forming layer.

In example embodiments, at least one of the second part and the third part of the depletion-forming layer may contact a corresponding one of the source electrode and the drain electrode.

In example embodiments, the gate electrode may be on the gate insulation layer above at least a portion of the first to third parts of the depletion-forming layer.

In example embodiments, the gate insulating layer may define an opening that exposes a portion of the depletion-forming layer, and the gate electrode may contact the depletion-forming layer through the opening.

In example embodiments, the opening may be on the first part of the depletion-forming layer.

In example embodiments, the normally-off HEMT may further include a first gate electrode between the first part and the gate insulation layer, wherein the first gate electrode and the gate electrode may be electrically connected to each other.

In example embodiments, the normally-off HEMT may further include a wire that electrically connects the first gate electrode and the gate electrode, and the gate insulation layer may expose the first gate electrode.

In example embodiments, the gate insulation layer may define an opening that exposes the first gate electrode, and the first gate electrode and the gate electrode may be electrically connected to each other through the opening.

In example embodiments, the first nitride semiconductor may include a gallium nitride (GaN) group material.

In example embodiments, the second nitride semiconductor may include a nitride that includes at least one of aluminum (Al), gallium (Ga), indium (In) and boron (B).

In example embodiments, the depletion-forming layer may include a p-type nitride semiconductor.

In example embodiments, the depletion-forming layer may include a III-V group nitride semiconductor material.

BRIEF DESCRIPTION OF THE DRAWINGS

These and/or other aspects will become apparent and more readily appreciated from the following description of nonlimiting example embodiments, taken in conjunction with the accompanying drawings. The drawings are not necessarily to scale, emphasis instead being placed upon illustrating principles of inventive concepts.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
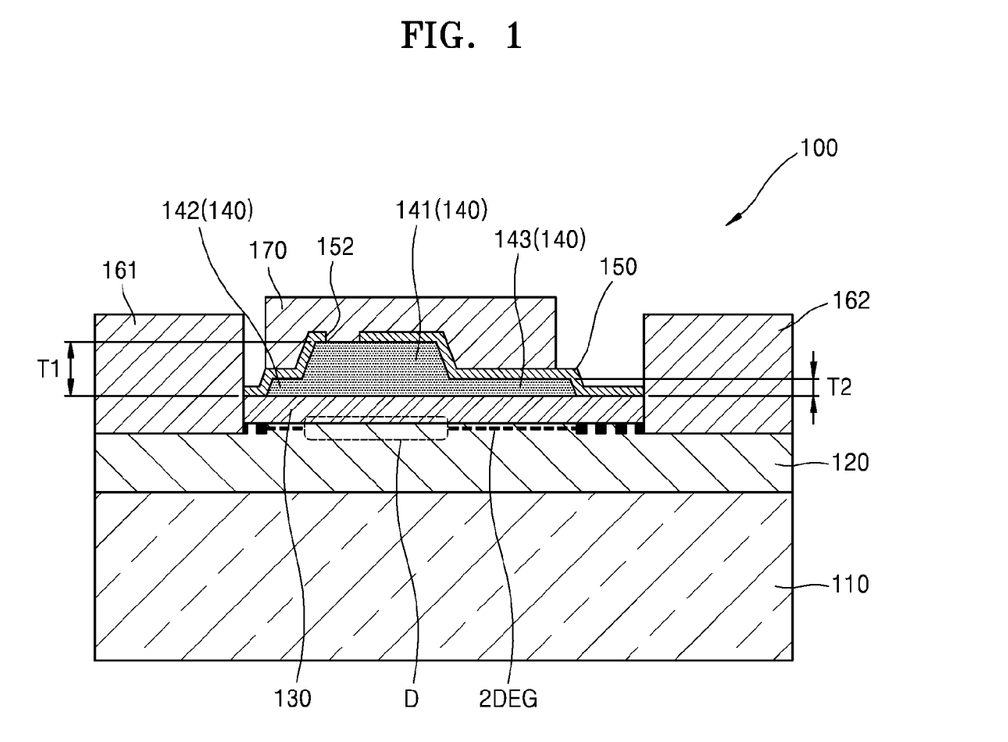
FIG. 1 is a cross-sectional view schematically showing a structure of a normally-off high electron mobility transistor (HEMT) according to example embodiments.

FIG. 1 is a cross-sectional view schematically showing a structure of a normally-off high electron mobility transistor (HEMT) 100 according to example embodiments.

Referring to FIG. 1, a channel layer 120 is formed on a substrate 110. The substrate 110 may be formed of, for example, directed-bonded copper or a semiconductor material such as sapphire, silicon (Si), silicon carbide (SiC), or gallium nitride (GaN). However, this is only illustrative, and the substrate 110 may be formed of other various materials.

The channel layer 120 may be formed of a first nitride semiconductor material. The first nitride semiconductor material may be a group DI-V compound semiconductor material. For example, the channel layer 120 may be a GaN group material layer. In detail, the channel layer 120 may be a GaN layer. In this case, the channel layer 120 may be an undoped GaN layer, and in some cases, the channel layer 120 may be a GaN layer doped with desired (and/or alternatively predetermined) impurities.

Although not shown, a buffer layer may be further provided between the substrate 110 and the channel layer 120. The buffer layer may reduce (and/or prevent) a decrease in crystallizability of the channel layer 120 by alleviating a lattice constant difference and a thermal expansion coefficient difference between the substrate 110 and the channel layer 120. The buffer layer may include a nitride including at least one among Al, Ga, In, and B and may have a single-layer structure or a multi-layer structure. For example, the buffer layer may be formed of AlN, GaN, AlGaN, InGaN, AlInN, or AlGaInN. A seed layer (not shown) for growing the buffer layer may be further provided between the substrate 110 and the buffer layer.

A channel supply layer 130 may be formed on the channel layer 120. The channel supply layer 130 may induce a two-dimensional electron gas (2DEG) in the channel layer 120. The 2DEG may be formed in the channel layer 120 below the interface between the channel layer 120 and the channel supply layer 130. The channel supply layer 130 may be formed of a second nitride semiconductor material that is different than the first nitride semiconductor material forming the channel layer 120. The second nitride semiconductor material may be different from the first nitride semiconductor material with respect to at least one of a polarization characteristic, an energy bandgap, and a lattice constant. In detail, the second nitride semiconductor material may be higher than the first nitride semiconductor material with respect to at least one of the polarization rate and the energy bandgap.

The channel supply layer 130 may be formed of at least one nitride that includes at least one among Al, Ga, In, and B and may have a single-layer structure or a multi-layer structure. In detail, the channel supply layer 130 may be formed of at least one of AlGaN, AlInN, InGaN, AlN, and AlGaInN. The channel supply layer 130 may be an undoped layer or a layer doped with desired (and/or alternatively predetermined) impurities. The thickness of the channel supply layer 130 may be, for example, less than several tens of nm. For example, the thickness of the channel supply layer 130 may be equal to or less than about 50 nm, but the thickness is not limited thereto.

A source electrode 161 and a drain electrode 162 may be formed on the channel layer 120. For example, the source electrode 161 and drain electrode 162 may be formed at both sides of the channel supply layer 130. The source electrode 161 and the drain electrode 162 may be electrically connected to the 2DEG. As shown in FIG. 1, the source electrode 161 and the drain electrode 162 may be formed to be inserted inside the channel layer 120. However, the configuration of the source electrode 161 and drain electrode 162 is not limited thereto. The source electrode 161 and the drain electrode 162 may be variously formed. For example, the source electrode 161 and the drain electrode 162 may be formed on the channel supply layer 130.

A depletion-forming layer 140 may be formed on the channel supply layer 130. The depletion-forming layer 140 includes a first part 141 having a first thickness T1 and a second part 142 having a second thickness T2 and a third part 143 having the second thickness T2.

Figure 2:
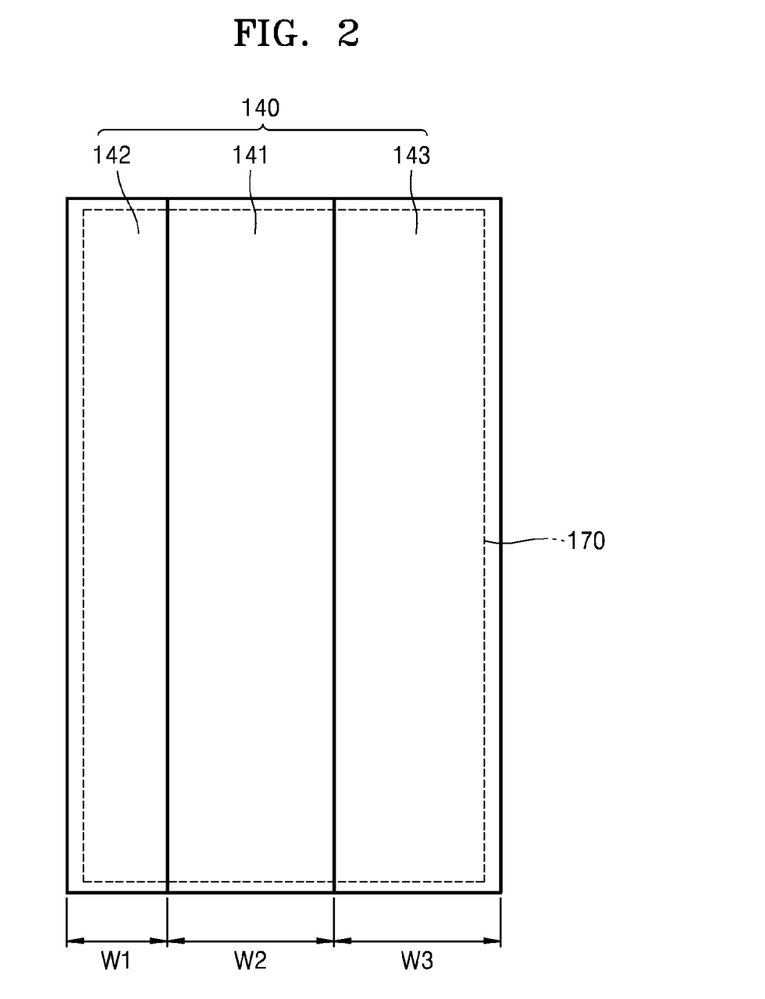
FIG. 2 is a partial top view of the normally-off HEMT according to example embodiments.

FIG. 2 is a partial top view of the normally-off HEMT 100 according to example embodiments. In FIG. 2, some components are omitted for convenience of description.

Referring to FIG. 2, the first part 141 may have a strip shape, and the second and third parts 142 and 143 may be formed long at both sides of the first part 141 in a lengthy direction of the first part 141. As shown in FIG. 2, the first part 141 may have a first width W1, the second part 142 may have a second width W2, and the third part 143 may have a third width W3. The first to third widths W1 to W3 may be different from each other. For example, the first width W1 may be greater than the third width W3 and the third width W3 may be greater than the second width W2. However, example embodiments are not limited thereto, and the depletion-forming layer 140 may be formed in various shapes. For example, alternatively at least two of the first to third widths W1 to W3 may be equal.

The second part 142 may be formed to be spaced apart from the source electrode 161 and the third part 143 may be formed to be spaced apart from the drain electrode 162. The first part 141 may be formed to be closer to the source electrode 161 than the drain electrode 162. However, example embodiments are not limited thereto.

The depletion-forming layer 140 may function to form a depletion region in the 2DEG. An energy bandgap of a portion of the channel supply layer 130, which is located below the depletion-forming layer 140, may increase due to the depletion-forming layer 140, resulting in forming the depletion region of the 2DEG at a portion of the channel layer 120 corresponding to the depletion-forming layer 140. Thus, the 2DEG may be cut off at a portion corresponding to the first part 141 of the depletion-forming layer 140, and electron density of the 2DEG may decrease at a portion corresponding to the second part 142 and the third part 143 of the depletion-forming layer 140. Electron densities of the 2DEG in a region between the depletion-forming layer 140 and the source electrode 161 and a region between the depletion-forming layer 140 and the drain electrode 162 are higher than electron density of the 2DEG below the second part 142 and the third part 143.

FIG. 1 shows that a region of the 2DEG having relatively high electron density is discriminated from a region of the 2DEG having relatively low electron density by the thicknesses of dots. Electron density is high as dots are thick. A region in which the 2DEG is cut off may be a 'cut-off region', and the normally-off HEMT 100 may have a normally-off characteristic due to the cut-off region.

The depletion-forming layer 140 may include a p-type semiconductor material. That is, the depletion-forming layer 140 may be a p-type semiconductor layer or a semiconductor layer doped with p-type impurities. In addition, the depletion-forming layer 140 may be formed of a group DI- V nitride semiconductor.

For example, the depletion-forming layer 140 may be formed of GaN, AlGaN, InN, AlInN, InGaN, or AlInGaN or doped with p-type impurities such as magnesium (Mg). In detail, the depletion-forming layer 140 may be a p-GaN layer or a p-AlGaN layer. The depletion-forming layer 140 may cause an energy bandgap of a portion of the channel supply layer 130 therebelow to increase, thereby forming a cut-off region of the 2DEG or a region having relatively low electron density.

An insulation layer 150 is formed on the depletion-forming layer 140. The insulation layer 150 may be referred to as a gate insulation layer 150 hereinafter. The gate insulation layer 150 may be extended to cover the channel supply layer 130. The gate insulation layer 150 may be formed to have the thickness of about 50 nm to about 300 nm. The gate insulation layer 150 may include at least one among aluminum oxide ($Al_2O_3$), silicon oxide ($SiO_x$), silicon nitride ($Si_xN_y$), scandium oxide ($Sc_2O_3$), aluminum nitride (AlN), gallium oxide ($Ga_2O_3$), gadolinium oxide ($Gd_2O_3$), aluminum gadolinium oxide ($Al_xGd_{2(1-x)}O_3$), aluminum gallium oxide ($Al_xGa_{2(1-x)}O_3$), magnesium oxide (MgO), and a combination thereof. Besides, any of insulation materials used for typical transistors may be used as a material for the gate insulation layer 150. An opening 152 is formed in the gate insulation layer 150 to expose at least a portion of the surface of the depletion-forming layer 140. For example, the opening 152 may be formed on the upper surface of the first part 141 of the depletion-forming layer 140. The opening 152 may be a through hole, a diameter of which is equal to or less than about 0.25 μm.

A gate electrode 170 is formed on the gate insulation layer 150. The gate electrode 170 may be arranged above the depletion-forming layer 140 and formed to contact the depletion-forming layer 140 through the opening 152. The gate electrode 170 may be formed to have a narrower area than the depletion-forming layer 140 as shown in FIG. 2. Since a contact area between the gate electrode 170 and the depletion-forming layer 140 is small (for example less than a width of the gate electrode 170), a leakage current is low and/or may be reduced. The gate electrode 170 may include any of various metal materials and metal compounds. The depletion-forming layer 140 may be formed to be wider than a region of the gate electrode 170.

As shown in FIG. 1, although the depletion-forming layer 140 has two thicknesses in FIG. 1, example embodiments are not limited thereto. For example, the depletion-forming layer 140 may have a plurality of thicknesses, wherein a part having the thickest thickness is formed at the central part or formed to be closer to the source electrode 161 at the central part, and the remaining parts have sequentially thinner thicknesses from the central part.

Figure 3A:
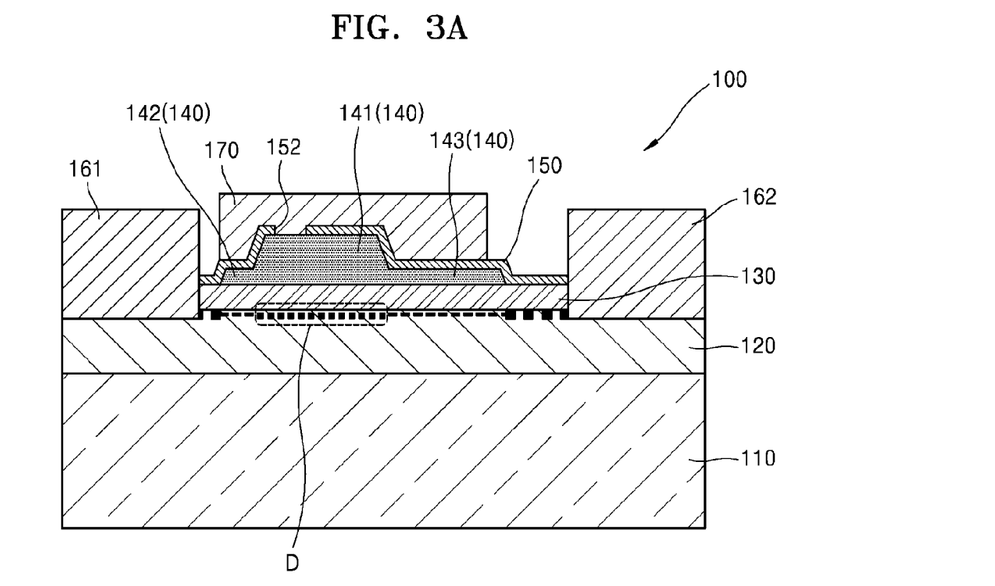
FIGS. 3A to 3C are cross-sectional views for describing an operation of the normally-off HEMT according to example embodiments.
Figure 3B:
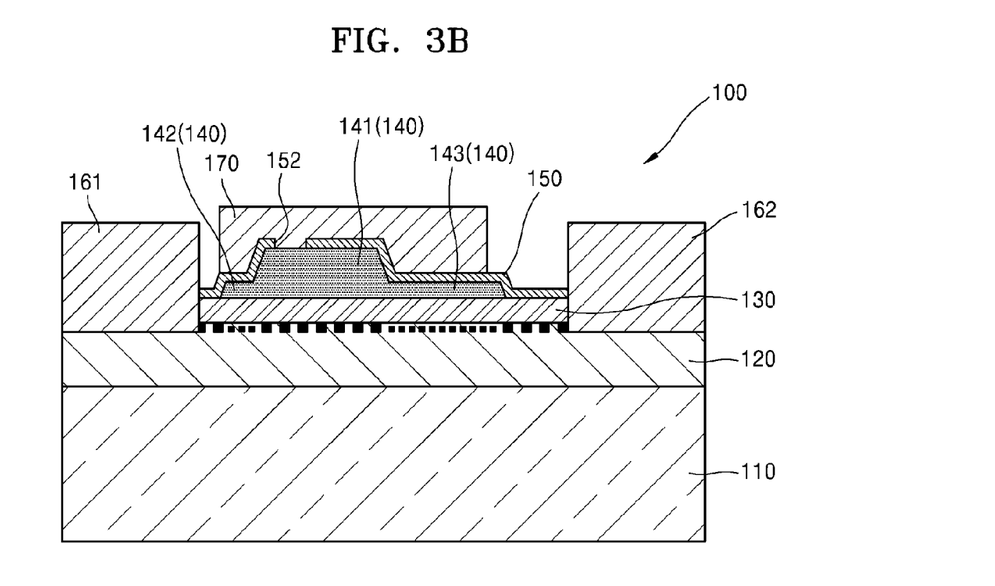
Figure 3C:
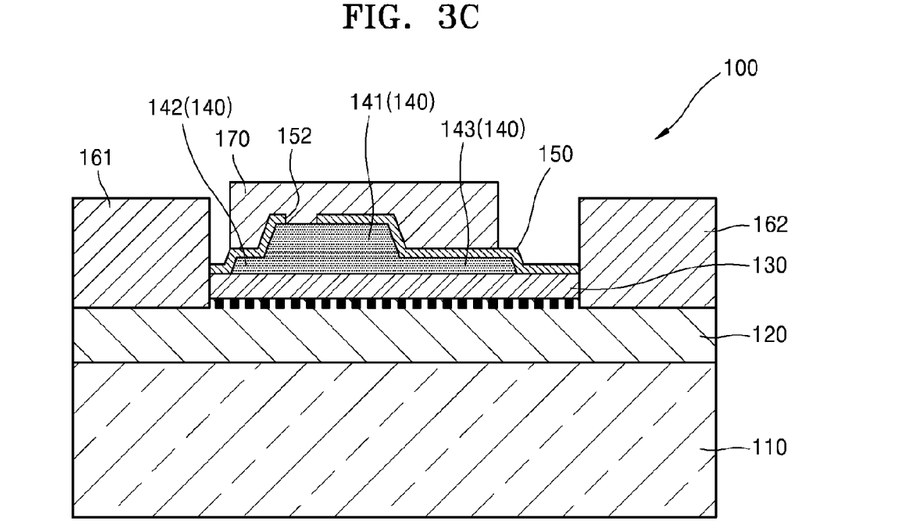

FIGS. 3A to 3C are cross-sectional views for describing an operation of the normally-off HEMT 100 according to example embodiments. Hereinafter, a region of the 2DEG having relatively high electron density is discriminated from a region of the 2DEG having relatively low electron density by the thicknesses of dots. Electron density is high as dots are thick.

An operation of the normally-off HEMT 100 according to example embodiments will now be described with reference to FIGS. 1 and 3A to 3C.

FIG. 1 shows a normally-off state of the normally-off HEMT 100. A region below the first part 141 is a cut-off region D in which the 2DEG does not exist.

Referring to FIG. 3A, when a voltage equal to or higher than a threshold voltage is applied to the gate electrode 170, the 2DEG is generated in a cut-off region D, thereby making the normally-off HEMT 100 be in an ON state. That is, a channel formed below the gate electrode 170 is in an ON state, and accordingly, a current flows through the 2DEG formed in the channel layer 120. The threshold voltage may vary according to the thickness of the first part 141 of the depletion-forming layer 140 and doping density of the first part 141.

Referring to FIG. 3B, when a voltage higher than a hole injection voltage of the second part 142 and third part 143 of the depletion-forming layer 140 is applied to the gate electrode 170, holes are injected into the channel supply channel 130 from the second part 142 and third part 143, and in response to the holes injected into the 2DEG, electron density of the 2DEG in a region below the depletion-forming layer 140 increases. Accordingly, an ON resistance decreases.

Referring to FIG. 3C, when a voltage higher than a hole injection voltage of the first part 141 of the depletion-forming layer 140 is applied to the gate electrode 170, holes are injected into the channel supply channel 130 from the first to third parts 141 to 143 of the depletion-forming layer 140, and in response to the injected holes, electron density of the 2DEG in a region below the depletion-forming layer 140 increases. Accordingly, the ON resistance decreases further.

In the normally-off HEMT 100 according to example embodiments, an area of the depletion-forming layer 140 below the gate electrode 170 increases, resulting in expanding a gate region. Since a contact area between the gate electrode 170 and the depletion-forming layer 140 is small, a leakage current is low.

When a zero voltage is applied to the gate electrode 170, an electric field is dispersed due to the first part 141 of the depletion-forming layer 140 and the gate electrode 170, and accordingly, a breakdown voltage of the normally-off HEMT 100 increases.

In addition, since the depletion-forming layer 140 is formed to be apart from the source electrode 161, a leakage current path connected from the gate electrode 170 to the source electrode 161 may be blocked.

Figure 4:
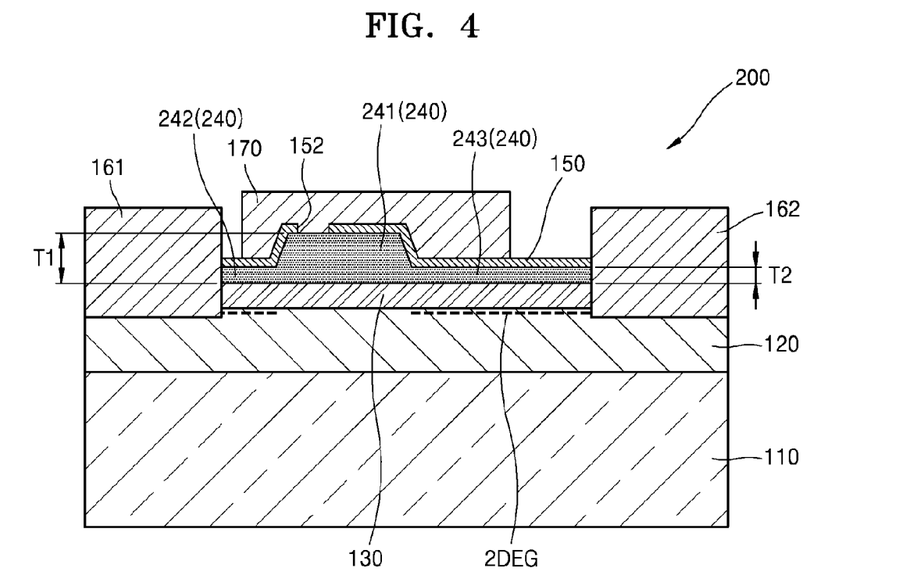
FIG. 4 is a cross-sectional view schematically showing a structure of a normally-off HEMT according to example embodiments.

FIG. 4 is a cross-sectional view schematically showing a structure of a normally-off HEMT 200 according to example embodiments. The same reference numerals are used for the same (and/or substantially the same) components as those in the normally-off HEMT 100 of FIG. 1, and their detailed description is omitted.

Referring to FIG. 4, a depletion-forming layer 240 may be formed on the channel supply layer 130. The depletion-forming layer 240 includes a first part 241 having the first thickness T1 and a second part 242 having the second thickness T2, and a third part 243 having the second thickness T2. The first part 241 may have a strip shape, and the second part 242 and third part 243 may be formed long at both sides of the first part 241 in a lengthy direction of the first part 241. However, example embodiments are not limited thereto, and the depletion-forming layer 240 may be formed in various shapes.

The second part 242 may be formed to contact the source electrode 161 and the third part 243 may be formed to contact drain electrode 162. The first part 241 may be formed to be closer to the source electrode 161 than the drain electrode 162. However, example embodiments are not limited thereto and the second part 242 and third part 243 may be alternatively configured. For example, the second part 242 may alternatively be formed similar to the second part 142 in FIG. 1, which does not contact the source electrode 161. As another example, the third part 243 may alternatively be formed similar to the third part 143 in FIG. 1, which does not contact the drain electrode 162. In other words, in a HEMT according to example embodiments, one of the second part 242 and the third part 243 may alternatively be arranged so it does not contact an adjacent one of the source electrode 161 and the drain electrode 162.

The depletion-forming layer 240 may function to form a depletion region in the 2DEG. An energy bandgap of a portion of the channel supply layer 130, which is located below the depletion-forming layer 240, may increase due to the depletion-forming layer 240, resulting in forming the depletion region of the 2DEG at a portion of the channel layer 120 corresponding to the depletion-forming layer 240. Thus, the 2DEG may be cut off at a portion corresponding to the first part 241 of the depletion-forming layer 240, and electron density of the 2DEG may decrease at a portion corresponding to the second part 242 and the third part 243 of the depletion-forming layer 240.

FIG. 4 shows that a region of the 2DEG having relatively high electron density is discriminated from a region of the 2DEG having relatively low electron density by the thicknesses of dots. Electron density is high as dots are thick. A region in which the 2DEG is cut off may be a 'cut-off region', and the normally-off HEMT 200 may have a normally-off characteristic due to the cut-off region.

The depletion-forming layer 240 may include a p-type semiconductor material. That is, the depletion-forming layer 240 may be a p-type semiconductor layer or a semiconductor layer doped with p-type impurities. In addition, the depletion-forming layer 240 may be formed of a group III-V nitride semiconductor.

For example, the depletion-forming layer 240 may be formed of GaN, AlGaN, InN, AlInN, InGaN, or AlInGaN or doped with p-type impurities such as Mg. In detail, the depletion-forming layer 240 may be a p-GaN layer or a p-AlGaN layer. The depletion-forming layer 240 may cause an energy bandgap of a portion of the channel supply layer 130 therebelow to increase, thereby forming a cut-off region of the 2DEG or a region having relatively low electron density.

Since an etching process of both ends of the depletion-forming layer 240 is unnecessary in the normally-off HEMT 200 according to example embodiments, a fabricating process of the normally-off HEMT 200 may be simplified.

In addition, the expansion of the second part 242 and third part 243 of the depletion-forming layer 240 may cause the ON resistance to decrease further.

Figure 5:
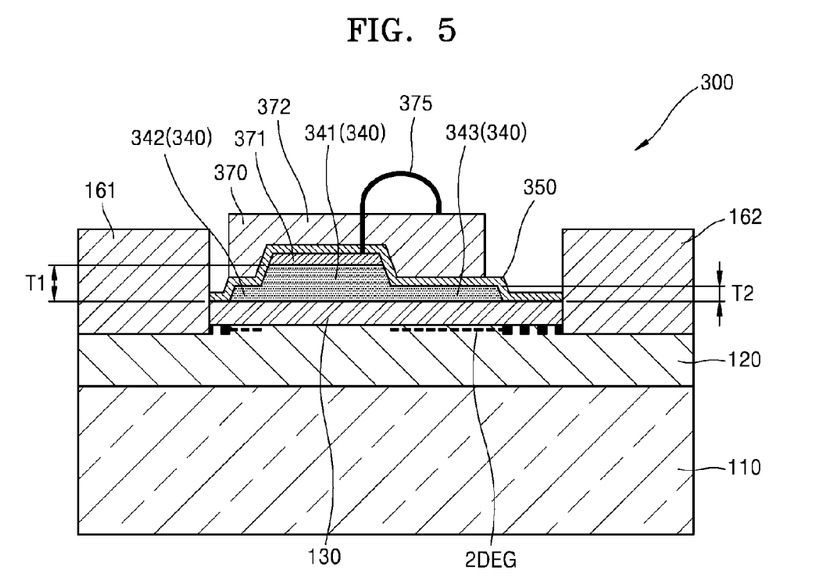
FIG. 5 is a cross-sectional view schematically showing a structure of a normally-off HEMT according to example embodiments.

FIG. 5 is a cross-sectional view schematically showing a structure of a normally-off HEMT 300 according to example embodiments. The same reference numerals are used for substantially the same components as those in the normally-off HEMT 100 of FIG. 1, and their detailed description is omitted.

Referring to FIG. 5, a depletion-forming layer 340 may be formed on the channel supply layer 130. The depletion-forming layer 340 includes a first part 341 having the first thickness T1, a second part 342 having the second thickness T2, and a third part 343 having the second thickness T2. The first part 341 may have a strip shape, and the second part 342 and third part 343 may be formed long at both sides of the first part 341 in a lengthy direction of the first part 341. However, example embodiments are not limited thereto, and the depletion-forming layer 340 may be formed in various shapes.

The second part 342 may be formed to be apart from the source electrode 161 and the third part 343 may be formed to be apart from the drain electrode 162. However, example embodiments are not limited thereto. The second part 342 may expand as in the second part 242 of FIG. 4 and may be formed to contact the source electrode 161 and the third part 343 may expand as in the third part 243 in FIG. 4 and contact the drain electrode 162. The first part 341 may be formed to be closer to the source electrode 161 than the drain electrode 162.

The depletion-forming layer 340 may function to form a depletion region in the 2DEG. An energy bandgap of a portion of the channel supply layer 130, which is located below the depletion-forming layer 340, may increase due to the depletion-forming layer 340, resulting in forming the depletion region of the 2DEG at a portion of the channel layer 120 corresponding to the depletion-forming layer 340. Thus, the 2DEG may be cut off at a portion corresponding to the first part 341 of the depletion-forming layer 340, and electron density of the 2DEG may decrease at a portion corresponding to the second part 342 and the third part 343 of the depletion-forming layer 340.

FIG. 5 shows that a region of the 2DEG having relatively high electron density is discriminated from a region of the 2DEG having relatively low electron density by the thicknesses of dots. Electron density is high as dots are thick. A region in which the 2DEG is cut off may be a 'cut-off region', and the normally-off HEMT 300 may have a normally-off characteristic due to the cut-off region.

The depletion-forming layer 340 may include a p-type semiconductor material. That is, the depletion-forming layer 340 may be a p-type semiconductor layer or a semiconductor layer doped with p-type impurities. In addition, the depletion-forming layer 340 may be formed of a group III-V nitride semiconductor. For example, the depletion-forming layer 340 may be formed of GaN, AlGaN, InN, AlInN, InGaN, or AlInGaN or doped with p-type impurities such as Mg. In detail, the depletion-forming layer 340 may be a p-GaN layer or a p-AlGaN layer. The depletion-forming layer 340 may cause an energy bandgap of a portion of the channel supply layer 130 therebelow to increase, thereby forming a cut-off region of the 2DEG or a region having relatively low electron density.

A first gate electrode 371 is formed on the depletion-forming layer 340. The first gate electrode 371 may be formed mainly on the first part 341.

An insulation layer 350 may be formed on the first gate electrode 371. The insulation layer 350 may be referred to a gate insulation layer 350 hereinafter. The gate insulation layer 350 may be formed to cover the depletion-forming layer 340 and the channel supply layer 130. The gate insulation layer 350 may be formed to have the thickness of about 50 nm to about 300 nm. The gate insulation layer 350 may include at least one among $Al_2O_3$, $SiO_x$, $Si_xN_y$, $Sc_2O_3$, AlN, $Ga_2O_3$, $Gd_2O_3$, $Al_xGd_{2(1-x)}O_3$, $Al_xGa_{2(1-x)}O_3$, MgO, and a combination thereof. However, example embodiments are not limited thereto.

A second gate electrode 372 is formed on the gate insulation layer 250. In detail, the second gate electrode 372 may be arranged above the depletion-forming layer 340. The first gate electrode 371 and the second gate electrode 372 may be formed of any of various metal materials and metal compounds. For example, the first gate electrode 371 and the second gate electrode 372 may be formed of titanium nitride (TiN), tungsten (W), platinum (Pt), or tungsten nitride (WN) or formed in a multi-layer structure of W/Ti/Al/Ti/TiN. The first gate electrode 371 may be formed to have the thickness of about 100 nm to about 300 nm.

The first gate electrode 371 and the second gate electrode 372 may be electrically connected to each other by a wire 375.

Figure 6:
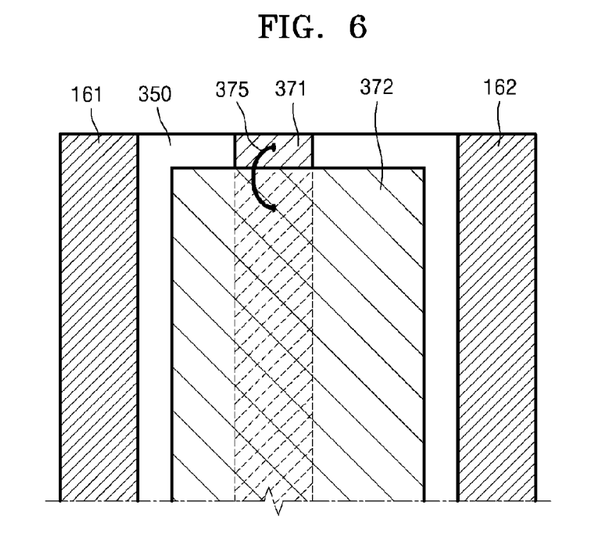
FIG. 6 is a top view showing an electrical connection between a first gate electrode and a second gate electrode of FIG. 5.

FIG. 6 is a top view showing an electrical connection between the first gate electrode 371 and the second gate electrode 372. For convenience of description, some components are not shown in FIG. 6.

Referring to FIG. 6, the second gate electrode 372 is formed on the first gate electrode 371, and the first gate electrode 371 is formed to be exposed by the second gate electrode 372. The wire 375 connects the exposed first gate electrode 371 to the second gate electrode 372.

Although the first gate electrode 371 and the second gate electrode 372 are connected to each other by the wire 375 in FIG. 6, example embodiments are not limited thereto. For example, the second gate electrode 372 may be formed to directly contact the exposed first gate electrode 371.

Alternatively, the first gate electrode 371 and the second gate electrode 372 may be electrically connected to each other through an opening (refer to 152 in FIG. 1) formed on the gate insulation layer 350.

Although FIGS. 5-6 illustrate the depletion-forming layer 340 is spaced apart from the source 161 and drain electrodes 162, example embodiments are not limited thereto. Alternatively, the depletion-forming layer 340 of the HEMT 300 in FIGS. 5-6 may be connected to at least one of the source 161 and drain electrodes 162.

Although FIGS. 5-6 illustrate the depletion forming layer 340 includes a second part 342 and a third part 343 that both have the second thickness T2, example embodiments are not limited thereto. For example, the second part 342 and the third part 343 may alternatively have different thicknesses.

Normally-off HEMTs according to example embodiments may reduce (and/or prevent) a current from leaking in an OFF state and may decrease a turn-on resistance. In addition, the expansion of a depletion-forming layer causes an electric field to be dispersed, and accordingly, a breakdown voltage of a normally-off HEMT increases.

Example embodiments described herein should be considered in a descriptive sense only and not for purposes of limitation. Descriptions of features or aspects within each HEMT according to example embodiments should typically be considered as available for other similar features or aspects in other HEMTs according to example embodiments. While some example embodiments have been particularly shown and described, it will be understood by one of ordinary skill in the art that variations in form and detail may be made therein without departing from the spirit and scope of the claims.

What is claimed is:

1. A normally-off high electron mobility transistor (HEMT) comprising:
   a channel layer including a first nitride semiconductor;
   a channel supply layer on the channel layer,
      the channel supply layer including a second nitride semiconductor,
      the channel supply layer configured to induce a two-dimensional electron gas (2DEG) in the channel layer;
   a source electrode and a drain electrode at sides of the channel supply layer;
   a depletion-forming layer on the channel supply layer,
      the depletion-forming layer configured to form a depletion region in at least a partial region of the 2DEG,
      the depletion-forming layer having at least two thicknesses;
   a gate insulation layer on the depletion-forming layer; and
   a gate electrode on the gate insulation layer,
      the gate electrode contacting the depletion-forming layer,
   wherein
   the gate insulation layer defines an opening that exposes a top surface of the depletion-forming layer, and
   the gate electrode contacts the top surface of the depletion-forming layer through the opening.

2. The normally-off HEMT of claim 1, wherein
   the depletion-forming layer includes a first part having a first thickness, and
   the depletion-forming layer includes a second part at a side of the first part and,
   the depletion-forming layer includes a third part at a different side of the first part,
   the second part and the third part having a second thickness.

3. The normally-off HEMT of claim 2, wherein the first thickness is thicker than the second thickness.

4. The normally-off HEMT of claim 2, wherein
   the first part of the depletion-forming layer is a strip shape,
   the second part and the third part of the depletion-forming layer are a strip shape in parallel to the first part.

5. The normally-off HEMT of claim 2, wherein the second part and the third part are spaced apart from the source electrode and the drain electrode, respectively.

6. The normally-off HEMT of claim 5, wherein
   the first part of the depletion-forming layer is configured to form the depletion region below the first part, and
   an electron density of the 2DEG below at least one of the second part and the third part of the depletion-forming layer is relatively lower than an electron density of the 2DEG that is not located below the depletion-forming layer.

7. The normally-off HEMT of claim 2, wherein at least one of the second part and the third part of the depletion-forming layer contacts a corresponding one of the source electrode and the drain electrode.

8. The normally-off HEMT of claim 2, wherein the gate electrode is on the gate insulation layer above at least a portion of the first to third parts of the depletion-forming layer.

9. The normally-off HEMT of claim 2, wherein the opening in the gate insulation layer is on the first part of the depletion-forming layer.

10. A normally-off high electron mobility transistor (HEMT) comprising:
    a channel layer including a first nitride semiconductor;
    a channel supply layer on the channel layer,
       the channel supply layer including a second nitride semiconductor,
       the channel supply layer configured to induce a two-dimensional electron gas (2DEG) in the channel layer;
    a source electrode and a drain electrode at sides of the channel supply layer;
    a depletion-forming layer on the channel supply layer,
       the depletion-forming layer configured to form a depletion region in at least a partial region of the 2DEG,
       the depletion-forming layer having at least two thicknesses,
       the depletion-forming layer including a first part having a first thickness,
       the depletion-forming layer including a second part at a side of the first part and,
       the depletion-forming layer including a third part at a different side of the first part,
       the second part and the third part having a second thickness;
    a gate insulation layer on the depletion-forming layer;
    a gate electrode on the gate insulation layer,
       the gate electrode contacting the depletion-forming layer; and
    a first gate electrode between the first part and the gate insulation layer,
    wherein the first gate electrode and the gate electrode are electrically connected to each other.

11. The normally-off HEMT of claim 10, further comprising:
    a wire that electrically connects the first gate electrode and the gate electrode, wherein
    the gate insulation layer exposes the first gate electrode.

12. The normally-off HEMT of claim 10, wherein
    the gate insulation layer defines an opening that exposes the first gate electrode, and
    the first gate electrode and the gate electrode are electrically connected to each other through the opening.

13. The normally-off HEMT of claim 1, wherein the first nitride semiconductor includes a gallium nitride (GaN) group material.

14. The normally-off HEMT of claim 1, wherein the second nitride semiconductor includes a nitride including at least one of aluminum (Al), gallium (Ga), indium (In) and boron (B).

15. The normally-off HEMT of claim 1, wherein the depletion-forming layer includes a p-type nitride semiconductor.

16. The normally-off HEMT of claim 15, wherein the depletion-forming layer includes a group III-V nitride semiconductor material.

17. The normally-off HEMT of claim 1, wherein
the depletion-forming layer includes a first part having a first thickness,
the depletion-forming layer includes a second part having a second thickness that is different than the first thickness,
the first part of the depletion-forming layer separates the gate electrode and the channel supply layer by a greater distance than the second part of the depletion-forming layer separates the gate electrode and the channel supply layer.

18. The normally-off HEMT of claim 1, wherein
the channel supply layer includes a first sidewall opposite a second sidewall, and
the source and drain electrodes contact the first sidewall and second sidewall of the channel supply layer respectively.

* * * * *